(12) United States Patent
Ali et al.

(10) Patent No.: US 11,022,576 B2
(45) Date of Patent: Jun. 1, 2021

(54) GAS SENSOR WITH A GAS PERMEABLE REGION

(71) Applicant: Sciosense B.V., AE Eindhoven (NL)

(72) Inventors: Syed Zeeshan Ali, Cambridge (GB); Matthew Govett, Cambridge (GB); Simon Jonathan Stacey, Ely (GB)

(73) Assignee: Sciosense B.V., AE Eindhoven (NL)

( * ) Notice: Subject to any disclaimer, the term of this patent is extended or adjusted under 35 U.S.C. 154(b) by 149 days.

(21) Appl. No.: 15/763,294

(22) PCT Filed: Sep. 19, 2016

(86) PCT No.: PCT/GB2016/052921
§ 371 (c)(1),
(2) Date: Mar. 26, 2018

(87) PCT Pub. No.: WO2017/055806
PCT Pub. Date: Apr. 6, 2017

(65) Prior Publication Data
US 2018/0202958 A1 Jul. 19, 2018

(30) Foreign Application Priority Data

Sep. 30, 2015 (GB) .................................... 1517238

(51) Int. Cl.
*G01N 27/22* (2006.01)
*G01N 27/414* (2006.01)
*G01N 27/12* (2006.01)

(52) U.S. Cl.
CPC ........... *G01N 27/128* (2013.01); *G01N 27/22* (2013.01); *G01N 27/414* (2013.01); *B81B 2201/02* (2013.01); *G01N 27/4148* (2013.01)

(58) Field of Classification Search
CPC .... G01N 27/128; G01N 27/414; G01N 27/22; G01N 27/4148
See application file for complete search history.

(56) References Cited

U.S. PATENT DOCUMENTS 5,834,777 A * 11/1998 Wong ................. G01N 21/0303
250/343
6,140,144 A 10/2000 Najafi
(Continued)

FOREIGN PATENT DOCUMENTS

CN 102159941 A 8/2011
CN 103663346 A 3/2014
(Continued)

OTHER PUBLICATIONS

C. Zorman et al., Additive Processes for Semiconductors and Dielectric Materials, Chapter 2, MEMS Materials and Processes Handbook, Editors: Reza Ghodssi and Pinyen Lin, 2011, Publisher: Springer. (Year: 2011).*
(Continued)

*Primary Examiner* — Luan V Van
*Assistant Examiner* — Caitlyn Mingyun Sun
(74) *Attorney, Agent, or Firm* — Slater Matsil, LLP

(57) ABSTRACT

A gas sensor with a gas permeable region is disclosed. In an embodiment a gas sensor includes a dielectric membrane formed on a semiconductor substrate having a cavity portion, a heater located within or over the dielectric membrane, a material for sensing a gas, wherein the material is located on one side of the dielectric membrane, a support structure located near the material, a gas permeable membrane coupled to the support structure so as to protect the material, wherein the semiconductor substrate forms the support structure.

17 Claims, 4 Drawing Sheets

(56) References Cited

U.S. PATENT DOCUMENTS

| | | | |
|---|---|---|---|
| 7,276,745 B2* | 10/2007 | Nakagawa | G01N 27/125 257/253 |
| 7,781,250 B2 | 8/2010 | Wang | |
| 7,849,727 B2* | 12/2010 | Gardner | G01N 33/0031 73/31.06 |
| 7,878,056 B2* | 2/2011 | Huang | G01F 1/6845 73/204.26 |
| 8,226,892 B2 | 7/2012 | Wilbertz | |
| 8,852,513 B1 | 10/2014 | Speer | |
| 2006/0001114 A1 | 1/2006 | Chen | |
| 2014/0186999 A1 | 7/2014 | Schweikert et al. | |
| 2014/0210036 A1* | 7/2014 | Sunier | H01L 21/84 257/467 |
| 2018/0202958 A1 | 7/2018 | Ali et al. | |

FOREIGN PATENT DOCUMENTS

| | | | |
|---|---|---|---|
| CN | 103718031 A | 4/2014 | |
| DE | 102006060113 A1 * | 6/2008 | G01N 27/12 |
| EP | 1 775 259 A1 | 4/2007 | |
| EP | 2 105 734 A1 | 9/2009 | |
| EP | 2 703 338 A1 | 3/2014 | |
| GB | 2 523 788 A | 9/2015 | |
| WO | 03067241 A2 | 8/2003 | |
| WO | WO-03067241 A2 * | 8/2003 | G01N 27/12 |
| WO | 2015071337 A1 | 5/2015 | |
| WO | 2015132563 A1 | 9/2015 | |

OTHER PUBLICATIONS

S. Raible et al., "Wafer Level Packaging of Micromachined Gas Sensors", IEEE Sensors Journal, vol. 6. No. 5., Oct. 1, 2006, pp. 1232-1235.
D. Briand et al., "Highly Integrated Wafer Level Packaged MOX Gas Sensors", Solid-State Sensors, Actuators and Microsystems Conference, 2007, Transducers 2007, Jun. 10, 2007, pp. 2401-2404.
S. Kuhne et al., "Wafer-level flame-spray-pyrolysis deposition of gas-sensitive layers on microsensors", Journal of Micromechanics and Microengineering, vol. 18. No. 3. Mar. 1, 2008.
J. Courbat et al., "Foil level packaging of a chemical gas sensor", Journal of Micromechanics & Microengineering. Institute of Physics, vol. 20. No. 5., May 1, 2010.
C. Ataman, "Humidity and Temperature Sensors on Plastic Foil for Textile Integration", Procedia Engineering, vol. 25, 11, Sep. 2011, pp. 136-139.
D. Briand et al., "Integration of MOX gas sensors on polyimide hotplates", Sensors and Actuators B: Chemical: International Journal Devoted to Research and Development of Physical and Chemical Transducers, vol. 130. No. 1, Mar. 10, 2008, pp. 430-435.
S.M. Lee, "Evaluation of the waterproof ability of a hydrophobic nickel micromesh with array type microholes," Journal of Micromechanics and Microengineering, 19 125024, Nov. 16, 2009, pp. 1-8.
International Search Report and Written Opinion from corresponding International Patent Application No. PCT/GB2016/052921, dated Feb. 9, 2017.
Search Report from corresponding UK Patent Application No. GB151723.0, dated Mar. 31, 2016.

* cited by examiner

GAS SENSOR WITH A GAS PERMEABLE REGION

FIELD OF THE INVENTION

This invention relates to sensing device having a gas permeable region.

BACKGROUND OF THE INVENTION

A gas permeable layer is generally used in a sensing device. Typically, reported devices have a gas permeable layer on package level.

U.S. Pat. No. 6,140,144 describes a sensor chip packaged by flip-chip on a ceramic (or similar material) substrate which has a hole through it. For some applications it can have a filter layer/screen in the hole.

U.S. Pat. No. 8,226,892 describes a gas sensor based on a FET, which has a gas permeable coating applied directly on the sensing material—this coating also prevents some types of gases from reaching the sensing material U.S. Pat. No. 8,852,513 describes a gas sensor package with two cavities, which are linked. One has the sensor chip, while the other has a filtered window/layer to the outside.

EP1775259 describes a package for MEMS—for pressure sensors on a suspended membrane or a buried cavity. The substrate on top has a hole to allow access to outside pressure.

US20060001114 describes a chip level package for gas sensors, where the lid is formed by wafer bonding a plastic moulded cap.

US20140186999 describes a vacuum package for bolometers using a cavity type lid.

U.S. Pat. No. 7,781,250 describes a wafer scale package for MEMS which has a cap substrate with cavity filled with gas.

EP2703338 describes a chip in a package, and the package as a gas permeable layer on top.

S Kuhne et. al "Wafer-level flame-spray-pyrolysis deposition of gas-sensitive layers on microsensors" Journal of Micromechanics and Microengineering 2008, describes gas sensor with a foil supported on a polyimide structure—however this is to protect the device during wafer dicing, and the foil is removed after dicing. They also mention that a gas permeable film can be used, but not how it would be connected, and show the use of a polyimide layer, but this is not suitable as the distance between the membrane and the gas permeable film is too small and would be affected by the micro-hotplate temperature.

S. M. Lee, "Evaluation of the waterproof ability of a hydrophobic nickel micromesh with array type microholes," describes a wafer proof nickel mesh for use in microphones, but discuss its use as protecting the chip, rather than the mesh being part of the chip. Additionally they do not describe its use in gas sensor.

SUMMARY

Micro-hotplate based resistive gas sensors comprise a thin dielectric membrane with an embedded heater, and a sensing layer (typically a metal oxide) on top of the membrane. It is desirable that the sensing material is protected against liquids and particulate which can affect its sensing properties. It is desirable that the packaging of the device is such that it allows air and gas flow to the device, while at the same time, also prevents water, particles and other contaminants from getting to the sensing material.

The invention describes a device that is a micro-hotplate based gas sensor chip with a gas permeable layer deposited or attached on a chip or wafer level to prevent water and dirt from getting to the gas sensing material.

The micro-hotplate gas sensor comprises a heater within the dielectric membrane supported by a semiconductor substrate, and a gas sensitive layer or a catalyst attached to the membrane which can be above or below the membrane. There may or may not be electrodes connected to the sensing material or catalyst to measure its electronic properties.

The gas permeable layer can be a polymer film such as Gore-Tex. For example, a small support structure can be fabricated on the chip, and the film deposited/attached on top. Alternately, if the sensing material is on the backside of the membrane, the film can be deposited/attached on the backside of the substrate.

The gas permeable layer can also be a film which has a mesh of small holes fabricated that allow air and gas to pass through, but prevent dirt and liquid. This can be attached for example by fabricating and wafer bonding a patterned structure of a metal, semiconductor and/or dielectric onto the chip or wafer.

Alternately, if the gas sensing material or catalyst is on the backside of the membrane, the gas permeable layer can be attached on the backside of the chip to the original semiconductor substrate.

The device can be package in a flip chip, or may have through silicon vias (TSVs) to electrically connect the device. Another packaging method is if the additional semiconductor substrate is smaller than the chip size, allowing the bond pads to be exposed and can be wire bonded.

The invention also describes a method to make such a device—which can be fabricated on a chip level or on a wafer level and then diced into individual chips.

The micro-hotplate may be a CMOS based micro-hotplate. The present invention provides a fully CMOS-compatible or CMOS-based micro-hotplate design based on a closed dielectric membrane structure. Here the dielectric membrane refers to a dielectric membrane in which the dielectric membrane is released by bulk etching of the underlying semiconductor substrate.

The device is preferably fabricated using CMOS-based or CMOS-usable materials. Here the terms "CMOS-based" material or "CMOS-usable" material refer to the materials which are compatible in the state-of-art CMOS processing steps or CMOS process. In this case the heater may be a resistive heater made from CMOS materials such as tungsten, aluminium, titanium, polysilicon, molybdenum or single crystal silicon. The heater may also be a MOSFET heater to allow easier drive control. The dielectric membrane itself may include layers of silicon dioxide and/or silicon nitride as well as spin on glass. The starting wafer may be either bulk silicon, or a silicon on insulator (SOI) wafer. The membrane may be formed by back etching the supporting semiconductor substrate. The membrane cavity may either have near vertical sidewalls (formed by the used of Deep Reactive Ion Etching (DRIE)), or may have sloping sidewalls (formed by the used of anisotropic or crystallographic etching methods such as potassium hydroxide (KOH) or TetraMethyl Ammonium Hydroxide (TMAH)). The use of DRIE allows circular membranes to be made more easily. Such a membrane will typically be a closed membrane structure, supported along its entire perimeter by the substrate. Alternately, the membrane can be formed by a front side etch. In this case the membrane formed is supported by one or more beams which mechanically connects to the substrate. Such a membrane can also be fabricated by a back side etch if the dielectric layers are patterned accordingly.

Alternatively the device may also be fabricated with some or all non-CMOS materials. For example the heater may be fabricated from platinum, or a supporting semiconductor substrate other than silicon may be used.

Aspects and preferred features are set out in the accompanying claims.

We disclose herein a gas sensing device comprising: a dielectric membrane formed on a semiconductor substrate comprising a bulk-etched cavity portion; a heater located within or over the dielectric membrane; a material for sensing a gas which is located on one side of the membrane; a support structure located near the material; and a gas permeable region coupled to the support structure so as to protect the material. It would be appreciated that the term "material" covers both a gas sensing material and a catalytic material which helps to sense a gas. The use of the dielectric membrane and the heater enables the gas sensing device to operate in high temperature, for example, up to 500° C. It would be appreciated that the permeable layer remains on the gas sensing material after the device is packaged. In other words, the gas permeable layer does not dissolve during a processing step, e.g. under high temperature.

The support structure may comprise an inorganic material. The support structure may comprise a semiconductor material. The support structure may comprise a material comprising glass or a ceramic. This is advantageous over organic materials since semiconductor materials and glass/ceramic materials can withstand harsher environments such as high temperatures or corrosion.

The support structure may be about 150-200 μm in length between the sensing layer and the gas permeable layer. This is advantageous for large heaters (200 μm or larger) to avoid power loss.

The gas permeable region may be configured to allow air and gas flow to the device and configured to block liquid and/or particles from getting to the material.

The material may be located on a first side of the dielectric membrane, the first side being an opposite side of the back-etched substrate.

The support structure may be located on the first side of the device and the permeable region is formed on the support structure.

The support structure may be formed surrounding the material.

The material may be located on a second side of the device, the second side being the same side where the back-etched substrate is formed.

The material may be formed in the back-etched cavity of the device.

The semiconductor substrate may form the support structure. The gas permeable region may be coupled with the semiconductor substrate supporting the dielectric membrane.

The membrane may be supported along its entire perimeter by the semiconductor substrate. The gas permeable region may be a polymer film. The polymer film may be polytetrafluoroethylene (PTFE) material, for example Gore-Tex.

The support structure may be formed on a top-side or back-side of a chip in which the device is included.

The material may be a gas sensing material.

The device may further comprise one or more electrodes underneath or above the gas sensing material.

The electrode may be configured to measure resistance and/or capacitance of the gas sensing material.

The gas sensing material may comprise a metal oxide material or a combination of metal oxides.

The gas sensing material may comprise a metal oxide material selected from a group comprising tin oxide, tungsten oxide, zinc oxide, chromium oxide, or the sensing layer comprises a combination of said metal oxides.

The material may be a catalytic material such as palladium or platinum. In this case the catalytic material, catalyses the combustion of the target gas if present, which increases the temperature of the membrane. This temperature change can be measured to determine the presence and/or concentration of gas.

The material may also form part of a gas FET (Field Effect Transistor) sensing structure. In this case, the material is present on the gate of the FET, or an electrode underneath the material is connected to the gate of the FET. Presence of gas alters the work function of the FET.

The dielectric membrane may be formed using an etching technique for bulk-etching the substrate, the etching technique being selected from a group comprising deep reactive ion etching (DRIE), anisotropic or crystallographic wet etching, potassium hydroxide (KOH) and tetramethyl ammonium hydroxide (TMAH).

The dielectric membrane may comprise:
a membrane cavity comprising vertical side walls or sloping side walls, or a cavity formed by a front side etch that does not extend all the way through the substrate;
one or more dielectric layers comprising silicon dioxide and/or silicon nitride;
one or more layers of spin on glass, and
a passivation layer over the one or more dielectric layers.

The material for sensing a gas may be formed on the passivation layer of the dielectric membrane or in the membrane cavity of the device.

The heater may be a resistive heater comprising a CMOS usable material comprising aluminium, copper, titanium, molybdenum, polysilicon, single crystal silicon tungsten, or titanium nitride. The heater can also be a MOSFET.

The device may be a CMOS based micro-hotplate in which the heater comprises a CMOS interconnect metal, and the dielectric membrane comprises CMOS dielectric layers.

The device may also be made with non-CMOS materials, for example using platinum as a heater.

The semiconductor substrate may be a bulk silicon substrate or an SOI substrate.

The device may be packaged in a flip chip on a printed circuit board (PCB). The device may comprise through silicon vias (TSVs).

The support structure may cover the dielectric membrane area, leaving a bond pad area open to allow wire bonding.

An array of gas sensing devices incorporating a gas sensing device as described above, wherein the array of gas sensing devices may be arranged on the same chip.

Each sensing device may comprise a separate gas permeable region.

The sensing devices may comprise a common gas permeable region.

We disclose herein a method of manufacturing a gas sensing device, the method comprising: forming a dielectric membrane formed on a semiconductor substrate comprising a back-etched cavity portion; forming a heater within or over the dielectric membrane; forming a material for sensing a gas on one side of the membrane; forming a support structure near the material; and forming an gas permeable region coupled to the support structure so as to protect the material.

The step of forming the dielectric membrane may comprise forming the dielectric membrane such that it is supported along its entire perimeter by the semiconductor substrate.

The step of forming the dielectric membrane comprises using an etching technique to back-etch the semiconductor substrate to form the back-etched portion.

The etching technique may be selected from a group comprising deep reactive ion etching (DRIE), anisotropic or crystallographic wet etching, potassium hydroxide (KOH) and tetramethyl ammonium hydroxide (TMAH).

BRIEF DESCRIPTION OF THE PREFERRED EMBODIMENTS

Some preferred embodiments of the invention will now be described by way of example only and with reference to the accompanying drawings, in which.

DETAILED DESCRIPTION OF THE PREFERRED EMBODIMENTS

Figure 1:
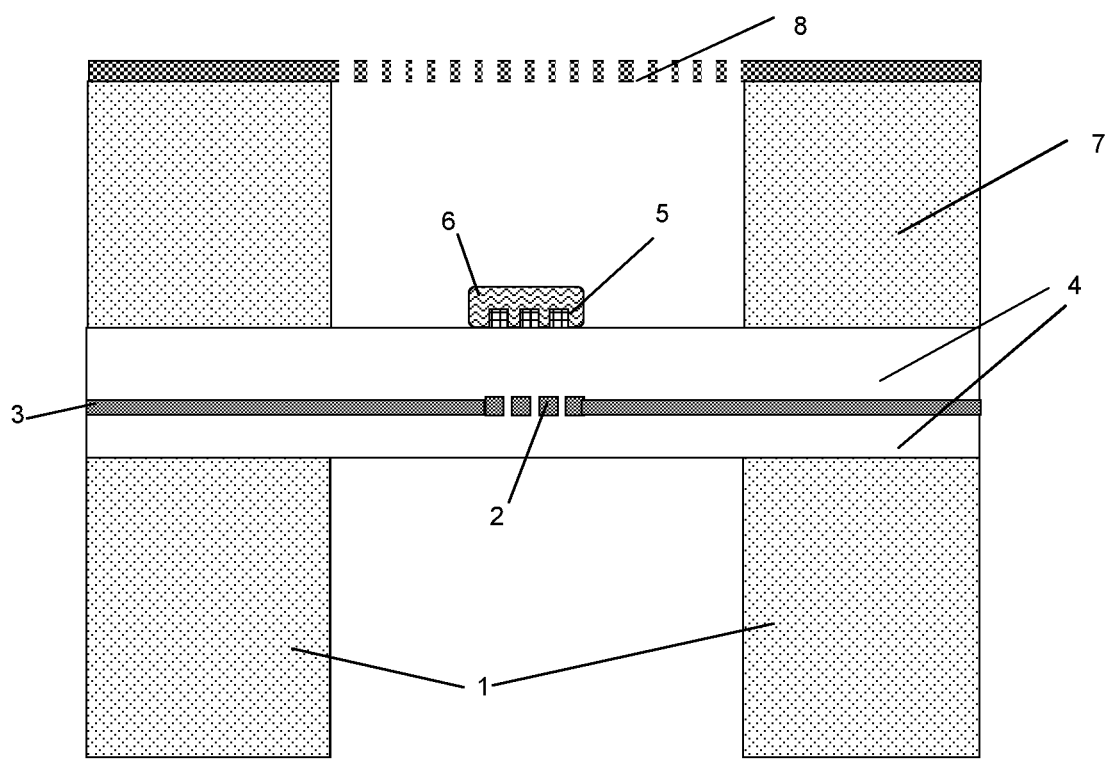
FIG. 1 shows a gas sensor with a gas permeable layer.

FIG. 1 shows a gas sensor with a sensing material 6, a silicon substrate 1 with a gas permeable layer 8 attached on top. The heater 2 and heater tracks or metallization 3 are embedded within the dielectric membrane 4 supported on the substrate 1. Electrodes 5 on top of the membrane connect to a sensing material 6 which has been grown or deposited on the membrane. An additional patterned semiconductor 7 (or the support structure) is attached at the top by wafer bonding and the gas permeable layer 8 is on top of this support structure 7. The dielectric membrane 4 and the passivation can include one or more combinations of silicon dioxide and silicon nitride, or other dielectric layers. In one example, the gas permeable layer or region is a metal, dielectric and/or semiconductor layer with multiple holes. This can be formed for example, by depositing a dielectric or metal layer on a substrate. Then making holes within the metal or dielectric layer. And then back etching a selected part of the substrate and joining this structure to the gas sensing hotplate by wafer bonding.

Figure 2:
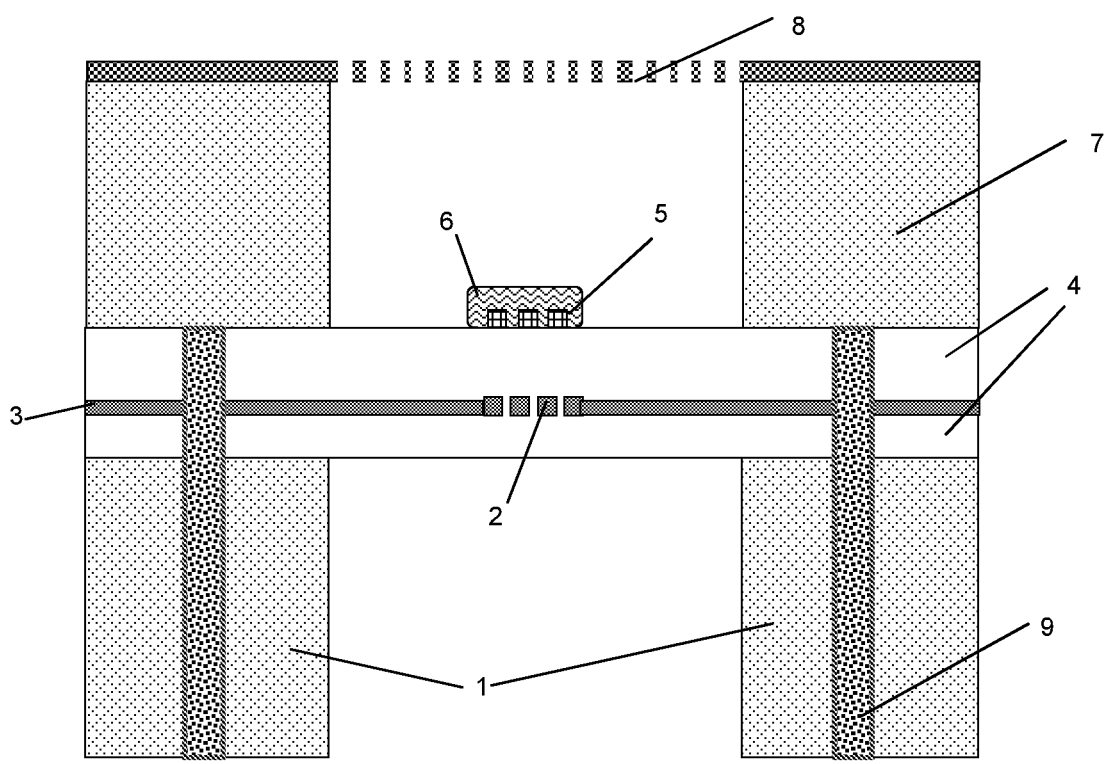
FIG. 2 shows an alternative gas sensor in which through silicon vias (TSVs) are used.

FIG. 2 shows an alternative gas sensor in which through silicon vias (TSVs) 9 are used to connect electrically to the device. The TSVs are generally connected to metallization or pads (not shown). The remaining features of the gas sensor are the same as those described in respect of FIG. 1 above and thus carry the same reference numbers.

Figure 3:
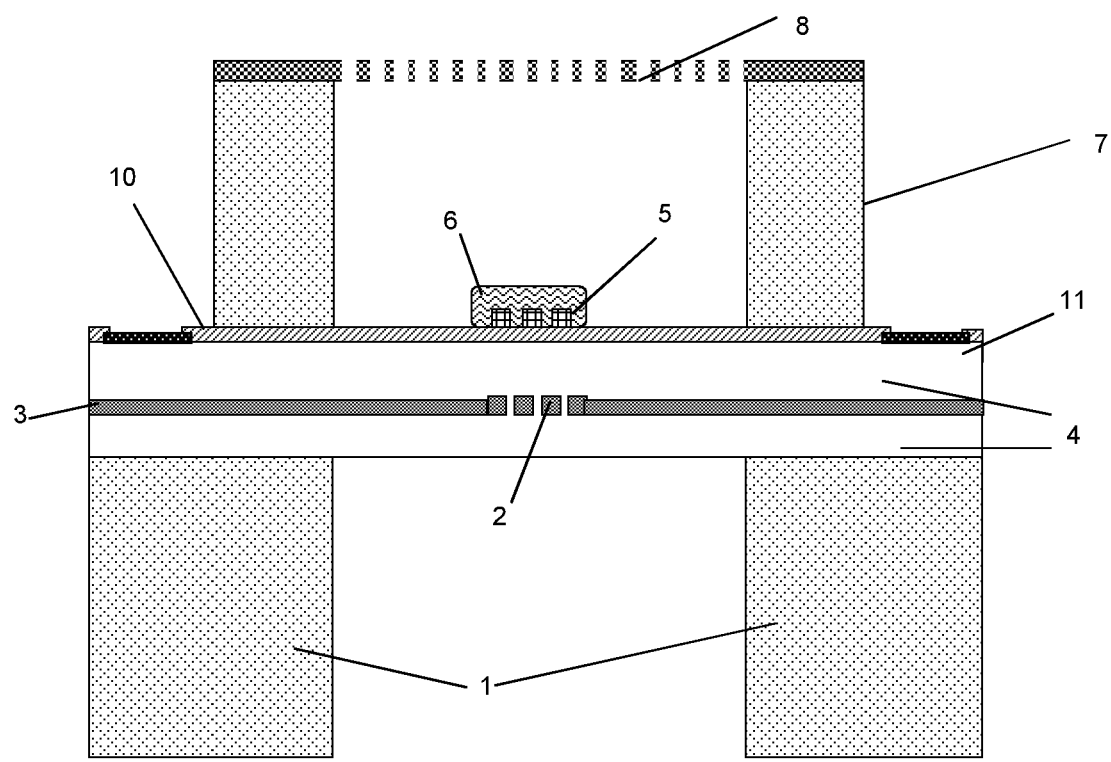
FIG. 3 shows an alternative gas sensor.

FIG. 3 shows an alternative gas sensor in which the support structure 7 (or the additional semiconductor substrate) is smaller, so that the bond pads 11 are exposed and can be electrically connected by wire bonding to either a package or a printed circuit board (not shown in the figure). Furthermore, this figure also shows a passivation layer 10—which may or may not be present on the device. The remaining features of the gas sensor are the same as those described in respect of FIGS. 1 and 2 above and thus carry the same reference numbers.

Figure 4:
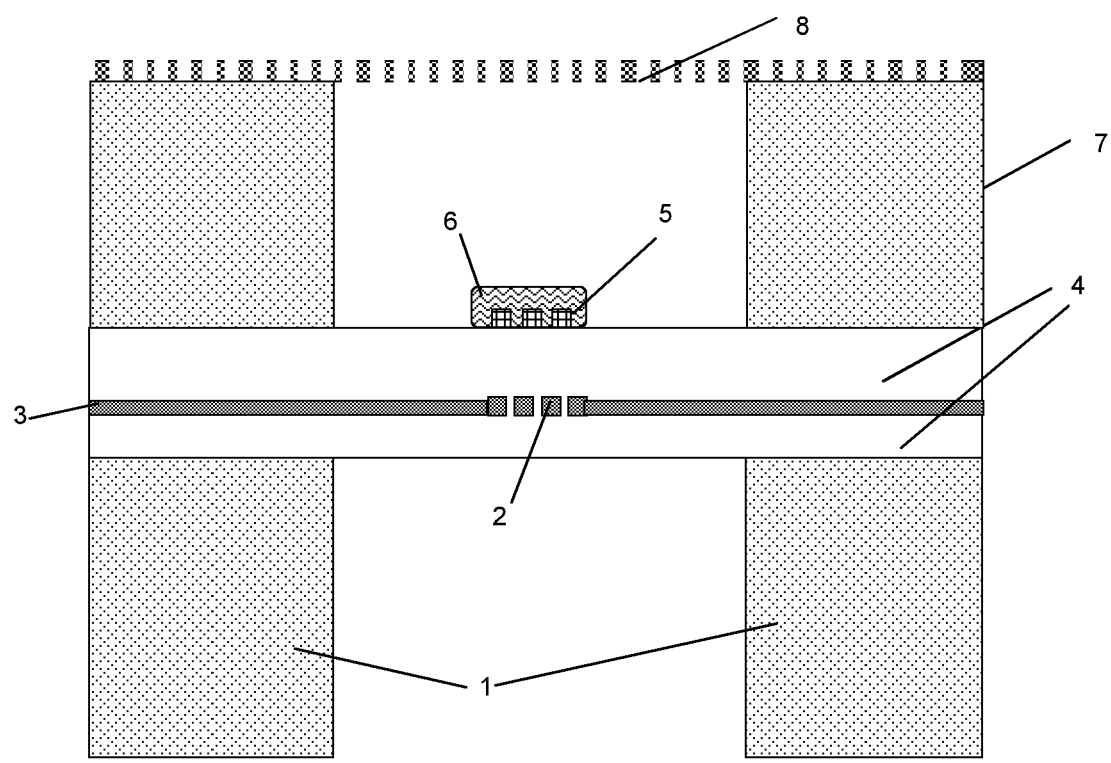
FIG. 4 shows an alternative gas sensor in which the gas permeable layer has holes.

FIG. 4 shows an alternative gas sensor in which the gas permeable layer 8 has holes, or is gas permeable even in regions which connect to the semiconductor support structure 7. The gas permeable layer can be for example a film such as gore-tex. It can also be a film of metal, dielectric and/or semiconductor with holes. The remaining features of the gas sensor are the same as those described in respect of FIGS. 1 to 3 above and thus carry the same reference numbers.

Figure 5:
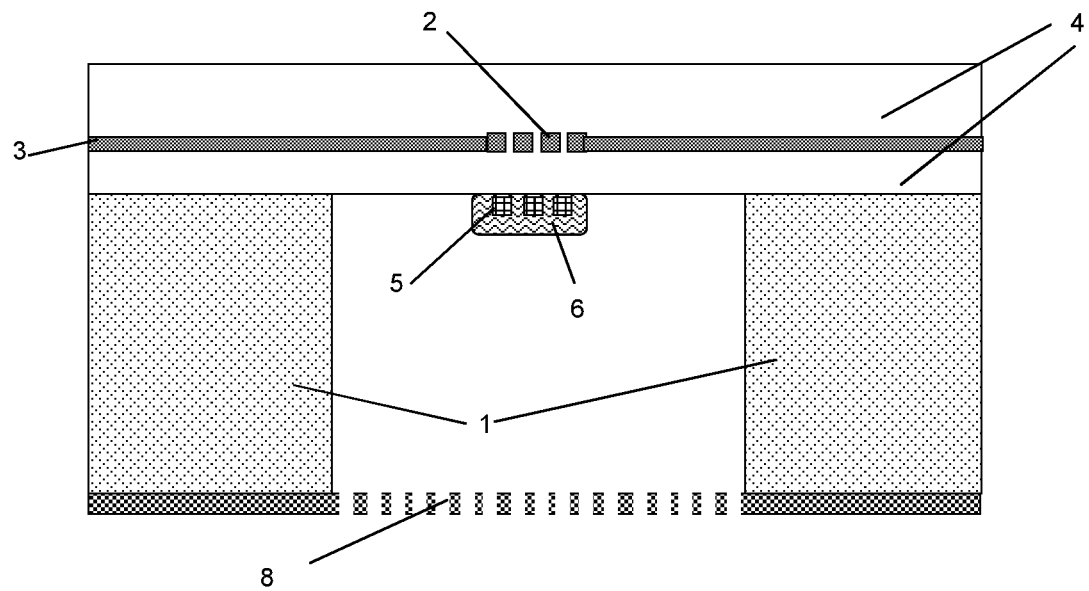
FIG. 5 shows an alternative gas sensor in which the sensing material is below the membrane, and the gas permeable layer is on the back side, supported by the silicon substrate itself.

FIG. 5 shows an alternative gas sensor in which the sensing material 6 is below the dielectric membrane 4, and the gas permeable layer 8 is on the back side, supported by the silicon back-etched substrate 1 itself. In this example, no additional support structure is needed as the back-etched substrate 1 acts as the support structure. The remaining features of the gas sensor are the same as those described in respect of FIGS. 1 to 4 above and thus carry the same reference numbers.

Figure 6:
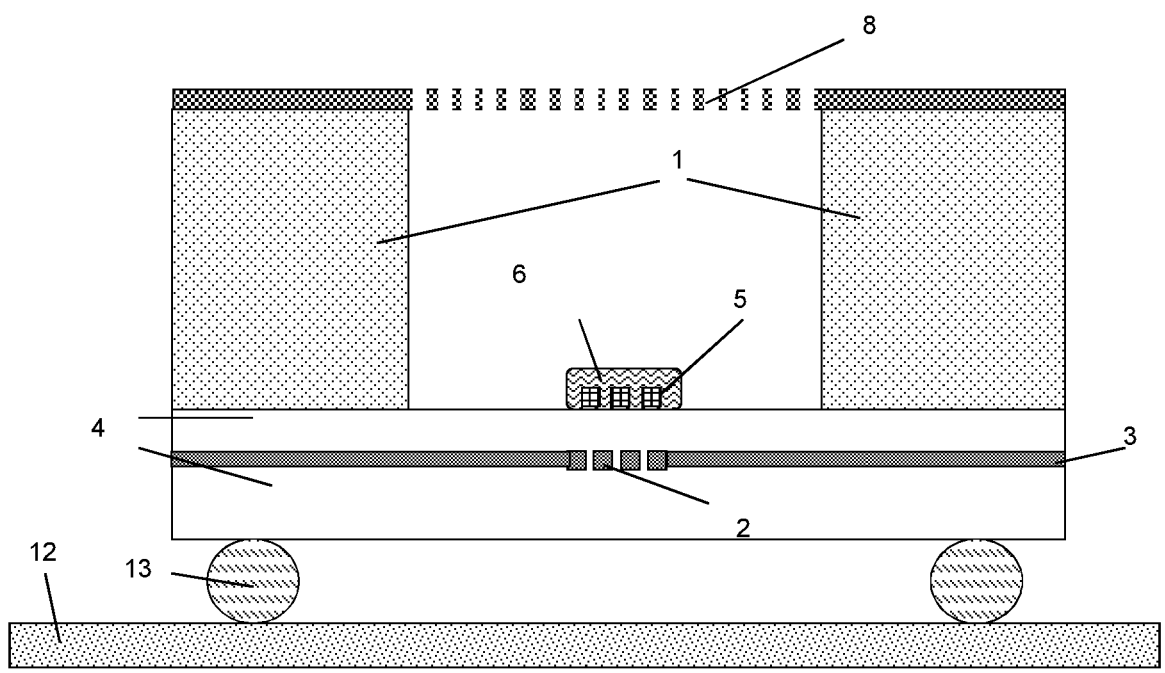
FIG. 6 shows an alternative gas sensor which is bonded by a flip chip.

FIG. 6 shows an alternative gas sensor with the sensing material 6 above the dielectric membrane 4, and a gas permeable layer 8 on the backside, bonded by flip chip with the bonds 13 connected to a printed circuit board (PCB) 12. The bond 13 can be generally connected to metallization or pads (not shown). In this example the chip is bonded on the front or top side of the chip. The remaining features of the gas sensor are the same as those described in respect of FIGS. 1 to 5 above and thus carry the same reference numbers.

Figure 7:
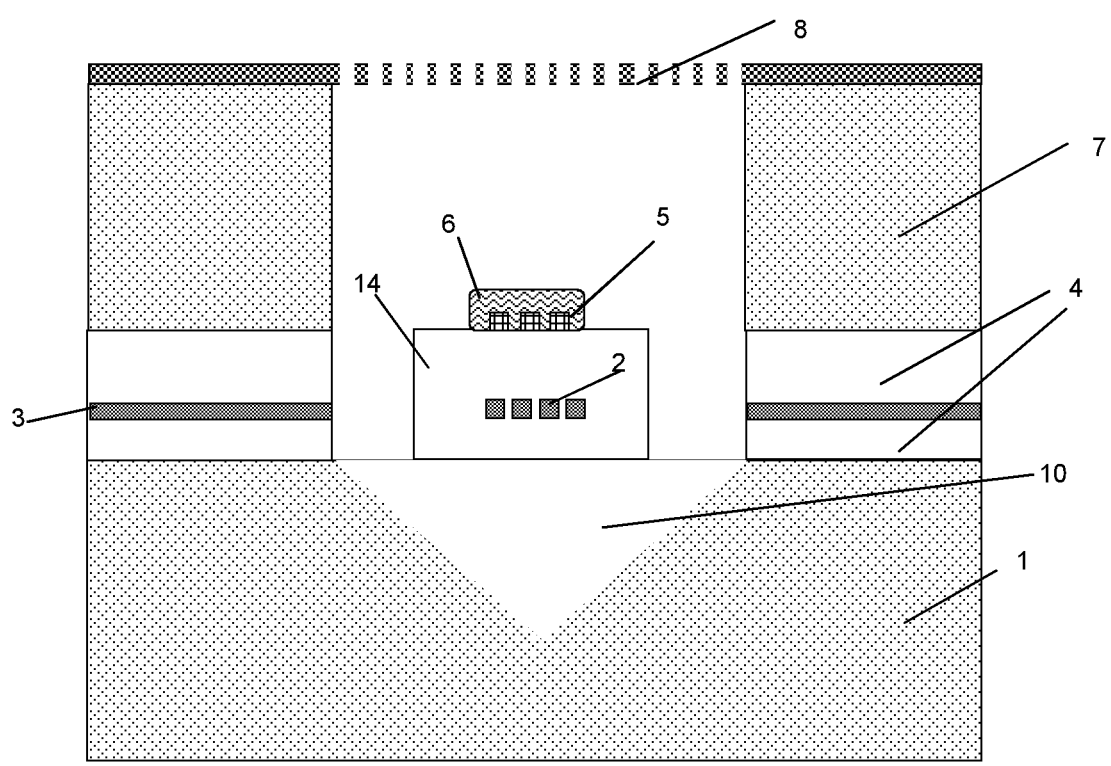
FIG. 7 shows an alternative gas sensor where the membrane is formed by a front side etch

FIG. 7 shows an alternative gas sensor, where the membrane 14 is a suspended membrane, formed by a front side etching of the substrate, and is supported by one or more beams (not shown). The membrane 14 includes dielectric material, for example, silicon oxide. The substrate 1 includes a triangle region 10 which is generally empty and is formed due to the front-side etching of the substrate. The remaining features of FIG. 7 are the same as those described above and thus carry the same reference numbers.

In the above mentioned embodiments, a gas sensing material 6 is disposed on an electrode 5. The electrode 5 is configured to measure resistance and/or capacitance of the gas sensing material 6. In an alternative embodiment, a catalytic material can be used instead of the gas sensing material. When the catalytic material is used, no electrode underneath it is generally necessary, since the detection is done by measuring the change in temperature of the membrane rather than the resistance or capacitance of the material. Alternately, the gas sensing material could be deposited as part of a gate, or an extended gate of a gas sensing FET.

In summary, the present invention provides a micro-hotplate based gas sensor chip that attaches the gas permeable layer onto the chip itself. The prior art reports typically have the gas permeable layer on the package, whereas the present invention provides the gas permeable layer in the chip level. The prior art devices are not for a membrane based device, whereas the present invention uses membrane based devices. The prior art devices generally have relatively larger holes for the purpose of allowing air flow, but do not stop water or particles. The prior art devices generally have a single hole (for example EP1775259). Alternately, the method of the present invention can allow a smaller package (or even a chip level package), easier handling during assembly, and lower cost. Furthermore, in the prior art device, the gas permeable layer can be formed on the sensing material itself which can affect the properties of the sensing material. This problem does not exist in the present invention as there is a support structure provided to create a gap between the sensing material and the gas permeable layer. Further, in some prior art devices, a plastic moulded cap is provided on which it is difficult to have the gas permeable layer. This problem does not exist in the present invention.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A gas sensing device comprising:
   a dielectric membrane formed on a semiconductor substrate comprising a bulketched cavity portion;
   a heater located within or over the dielectric membrane;
   a material configured to sense a gas, wherein the material is located on one side of the dielectric membrane;
   a support structure located near the material; and
   a gas permeable membrane coupled to the support structure so as to protect the material,
   wherein the semiconductor substrate forms the support structure,
   wherein the side on which the gas sensing material is located is the same side where the support structure is located or where the gas permeable membrane is coupled to the semiconductor substrate.

2. The device according claim 1, wherein the support structure surrounds the material.

3. The device according to claim 1, wherein the material is located on a second side of the device, the second side being the same side where the semiconductor substrate is located.

4. The device according to claim 1, wherein the dielectric membrane is supported along its entire perimeter by the semiconductor substrate.

5. The device according to claim 1, wherein the gas permeable membrane is a polymer film, optionally wherein the polymer film is gore-tex, or wherein the gas permeable membrane comprises a film of metal, dielectric or semiconductor with several holes, and/or wherein the support structure is formed on a top-side or back-side of a chip in which the device is included.

6. The device according to claim 1, further comprising an electrode underneath the gas sensing material, optionally wherein the electrode is configured to measure resistance and/or capacitance of the gas sensing material.

7. The device according to claim 6, wherein the gas sensing material comprises a metal oxide material or a combination of metal oxides, optionally wherein the gas sensing material comprises a metal oxide material selected from the group consisting of tin oxide, tungsten oxide, zinc oxide, and chromium oxide, or wherein the gas sensing material comprises a combination of the metal oxides.

8. The device according to claim 1, wherein the material is a catalytic material, or wherein the material is a gate electrode, or is electrically connected to a gate electrode of a field effect transistor (FET).

9. The device according to claim 1, wherein either the dielectric membrane is formed using an etching technique for back-etching the semiconductor substrate, the etching technique being selected from the group consisting of deep reactive ion etching (DRIE), anisotropic or crystallographic wet etching, potassium hydroxide (KOH) and tetramethyl ammonium hydroxide (TMAH), or wherein the dielectric membrane is formed by a front side etch of the semiconductor substrate.

10. The device according to claim 1, wherein the dielectric membrane comprises:
    a membrane cavity comprising vertical side walls or sloping side walls or a cavity formed by a front side etch that does not extend all the way through the semiconductor substrate;
    one or more dielectric layers comprising silicon dioxide and/or silicon nitride; and
    one or more layers of spin on glass, and a passivation layer over the one or more dielectric layers,
    optionally wherein the material for sensing the gas is formed on the passivation layer of the dielectric membrane or in the membrane cavity of the device.

11. The device according to claim 1, wherein the heater is a resistive heater comprising a CMOS usable material comprising aluminium, copper, titanium, molybdenum, polysilicon, single crystal silicon tungsten, or titanium nitride.

12. The device according to claim 1,
    wherein the device is a CMOS based micro-hotplate in which the heater comprises a CMOS interconnect metal, and the dielectric membrane comprises CMOS dielectric layers, and/or
    wherein the semiconductor substrate is a bulk silicon substrate or a SOI substrate, and/or
    wherein the device is packaged in a flip chip on a printed circuit board (PCB), and/or
    wherein the device comprises through silicon vias (TSVs), and/or
    wherein the support structure covers the dielectric membrane, leaving a bond pad area open to allow wire bonding.

13. An array comprising:
    a plurality of the gas sensing devices according to claim 1,
    wherein the array of the plurality of the gas sensing devices is arranged on the same chip,
    optionally wherein either:
    each of the plurality of the gas sensing devices comprises a separate gas permeable membrane and a distance between the separate gas permeable membrane and the material for sensing is between about 150 μm and about 200 μm, or
    the plurality of the gas sensing devices comprises a common gas permeable membrane and a distance between the common gas permeable membrane and the material for sensing in each of the plurality of the gas sensing device is between about 150 μm and about 200 μm.

14. The device according to claim 1, wherein the gas permeable membrane is coupled to the support structure such that the gas permeable membrane and the support structure form a cavity so as to protect the material.

15. The device according to claim 3,
    wherein the material is formed in the bulketched cavity portion of the device, and/or wherein the gas permeable membrane is coupled with the semiconductor substrate supporting the dielectric membrane.

16. A gas sensing device comprising:
a semiconductor substrate comprising a bulketched cavity portion;
a dielectric membrane formed on a first side of the semiconductor substrate;
a heater located within or over the dielectric membrane;
a gas permeable membrane coupled to a second side of the semiconductor substrate; and
a material configured to sense a gas located on a side of the dielectric membrane,
wherein the gas permeable membrane is configured to protect the material.

17. A gas sensing device comprising:
a dielectric membrane formed on a semiconductor substrate comprising a bulk-etched cavity portion;
a heater located within or over the dielectric membrane;
a material configured to sense a gas, wherein the material is located on one side of the dielectric membrane;
a support structure located near the material; and
a gas permeable membrane coupled to the support structure so as to protect the material,
wherein the semiconductor substrate forms the support structure, and
wherein the material is formed in the bulk-etched cavity portion of the device and/or the gas permeable membrane is covered with a semiconductor substrate supporting the dielectric membrane.

* * * * *